(12) United States Patent
Buschbom

(10) Patent No.: US 6,800,944 B2
(45) Date of Patent: Oct. 5, 2004

(54) POWER/GROUND RING SUBSTRATE FOR INTEGRATED CIRCUITS

(75) Inventor: Milton Lee Buschbom, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/033,825

(22) Filed: Dec. 19, 2001

(65) Prior Publication Data
US 2003/0111738 A1 Jun. 19, 2003

(51) Int. Cl.$^7$ .............................................. H01L 23/48
(52) U.S. Cl. ...................... 257/778; 257/779; 257/780; 257/784; 257/787
(58) Field of Search ................................ 257/778, 779, 257/780, 784, 787, 738, 693, 692; 438/108, 612, 617

(56) References Cited

U.S. PATENT DOCUMENTS

| | | | |
|---|---|---|---|
| 5,258,648 A | | 11/1993 | Lin |
| 5,981,314 A | * | 11/1999 | Glenn et al. ................. 438/127 |
| 5,982,186 A | | 11/1999 | Buschbom |
| 6,008,534 A | * | 12/1999 | Fulcher ....................... 257/691 |
| 6,075,710 A | * | 6/2000 | Lau ............................. 257/737 |
| 6,133,627 A | | 10/2000 | Khandros et al. |
| 6,137,168 A | * | 10/2000 | Kirkman ..................... 257/691 |
| 6,150,193 A | * | 11/2000 | Glenn .......................... 438/113 |
| 6,168,974 B1 | * | 1/2001 | Chang et al. ................ 438/109 |
| 6,218,729 B1 | * | 4/2001 | Zavrel, Jr. et al. .......... 257/698 |
| 6,291,898 B1 | * | 9/2001 | Yeh et al. .................... 257/786 |
| 6,448,640 B2 | * | 9/2002 | Corisis ........................ 257/691 |
| 6,489,682 B1 | * | 12/2002 | Yeh et al. .................... 257/738 |
| 6,538,319 B2 | * | 3/2003 | Terui ........................... 257/704 |
| 6,570,249 B1 | * | 5/2003 | Liao et al. ................... 257/724 |
| 6,664,621 B2 | * | 12/2003 | Smith et al. ................. 257/692 |

* cited by examiner

Primary Examiner—Donghee Kang
Assistant Examiner—Quang Vu
(74) Attorney, Agent, or Firm—Frederick J. Telecky, Jr.; W. James Brady, III

(57) ABSTRACT

A substrate (110) for an unpackaged integrated circuit (IC) chip (118). The substrate comprises an insulative material (112), a plurality of contacts (114) disposed thereon, and a conductive ring (150) disposed around the outer perimeter of the contacts (114). Conductive traces (115) may be disposed around one or more contacts (114) and may be coupled to the conductive ring (150). An electro-less plating technique is utilized to plate contacts (114), avoiding unnecessary conductive material such as plating stubs being included in the contact (114) pattern, reducing interference. The conductive ring (150) shields the chip (118) from interference.

26 Claims, 4 Drawing Sheets

US 6,800,944 B2

POWER/GROUND RING SUBSTRATE FOR INTEGRATED CIRCUITS

TECHNICAL FIELD

The present invention relates generally to the packaging of integrated circuits (IC's), and more particularly to circuit boards or substrates for mounting and packaging IC's.

BACKGROUND

Semiconductors are used for integrated circuits for electronic applications, including radios, televisions, cell phones, and personal computing devices, as examples. With the trend towards miniaturization of electronic devices, there is a trend towards making IC's and the packages thereof smaller.

One result of the IC miniaturization trend is the development of ball grid array (BGA) and chip scale packages (CSP's). These packages utilize surface-mount technologies in which the IC is coupled to a substrate by surface contacts rather than through-hole connections, as used in prior art dual in-line (DIP) packages, for example. A ball grid array package comprises a series of terminals on the underside of an integrated circuit that are substantially spherical in shape. These terminals may be arranged in multiple rows around the periphery of the underside of the integrated circuit. Because multiple rows can be used, a higher number of terminals can exist in a ball grid array package in comparison to some other technologies. Typically, a ball grid array is connected to a printed circuit board by soldering the balls to contacts on the printed circuit board.

Another type of surface mount IC package is a chip scale package. A working definition of the term chip scale package as used herein typically refers to a package that is about 1.2 times the size (length and/or width) of the IC chip (die) or less, or 1.2 times the area, e.g., for chip having an area of 100 square $mil^2$, the package is around 120 $mil^2$ or less, e.g., the package is slightly larger than the chip. A chip scale package permits an integrated circuit to be attached to a printed-circuit (PC) board face up or face-down, with the integrated circuit's pads connecting to the PC board's pads through individual balls of solder.

SUMMARY OF THE INVENTION

Preferred embodiments of the present invention achieve technical advantages as a substrate and package for an integrated circuit chip having a conductive ring around the perimeter of the contact terminals, which may be used as a ground or power ring.

In one embodiment, disclosed is a substrate for an unpackaged integrated circuit chip having surface mount contacts disposed thereon in a pattern. The substrate includes an insulating material and a conductive material disposed over the insulating material. The conductive material comprises a plurality of contacts arranged in a pattern corresponding to the integrated circuit contact pattern. The conductive material also comprises a conductive ring disposed around the periphery of the contact pattern. The substrate contacts are coupleable to the integrated circuit chip surface mount contacts.

In another embodiment, disclosed is a package for an integrated circuit chip having surface mount contacts disposed thereon in a pattern. The package includes a substrate having an insulating material and a conductive material disposed over the insulating material. The conductive material comprises a plurality of contacts arranged in a pattern corresponding to the integrated circuit contact pattern. The conductive material also comprises a conductive ring disposed around the periphery of the contact pattern. The substrate contacts are coupleable to the integrated circuit chip surface mount contacts.

In another embodiment, disclosed is a method of manufacturing a substrate for an unpackaged integrated circuit chip having surface mount contacts disposed thereon in a pattern. The method comprises providing an insulating material, disposing a conductive material over the insulating material, and patterning the conductive material to form a plurality of contacts arranged in a pattern corresponding to the integrated circuit contact pattern. The method includes forming a ring in the conductive material around the periphery of the conductive material contact pattern. The substrate contacts are coupleable to the integrated circuit chip surface mount contacts.

Advantages of embodiments of the present invention include providing a conductive ring around contacts of surface mount integrated circuit chip, which may be used for shielding or for providing power. Individual contacts or terminals may be completely surrounded by a ground signal, which is particularly advantageous for coaxial connections, high-speed applications, or sensitive signals. Groups of contacts or terminals may also be shielded, which is advantageous in certain design scenarios. A substrate having a conductive ring in accordance with embodiments of the present invention may be covered with an insulative material, and the insulative material may be coated with a conductive or dissipative material that makes electrical contact to the conductive ring to provide a completely electromagnetic interference (EMI)/radio frequency interference (RFI) shielded package. Advantageously, the conductive ring may be formed when the contact terminals and/or traces of the substrate are patterned.

BRIEF DESCRIPTION OF THE DRAWINGS

The above features of embodiments of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Prior art chip scale packages will be discussed, followed by a description of embodiments of the present invention and a discussion of some advantages thereof. One or two substrates are shown in each figure, although many substrates may be present, arranged in rows and columns, prior to singulation, for example.

Figure 1:
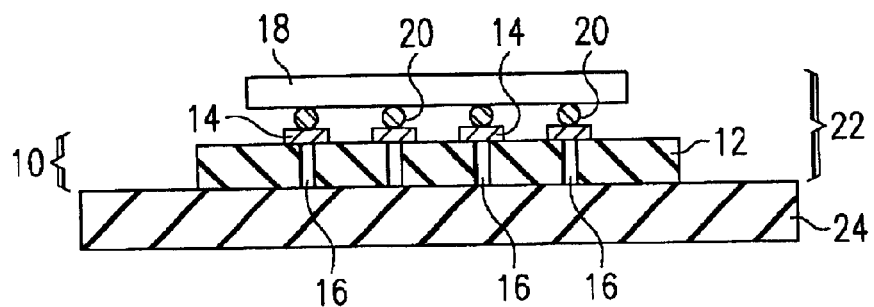
FIG. 1 illustrates a cross-sectional view of a prior art chip scale package having a substrate and an integrated circuit chip bonded thereto, which substrate is mounted on a printed circuit board (PCB)

FIG. 1 shows a cross-sectional view of a prior art substrate 10 which comprises an insulating material 12 and a conductive material that has been formed into terminals 14 and traces 15, (shown in FIG. 2) disposed thereon. The substrate 10 is coupled to an integrated circuit chip 18 by an electrical connection 20 which may comprise solder balls, for example. The integrated circuit package 22 comprises the substrate 10 and the integrated circuit chip 18. The integrated circuit package 22 is coupled to a printed circuit board (PCB) 24 using solder which electrically couples the terminals 14 of the substrate 10 to contacts or bond pads (not shown) of the PCB 24. The insulating material 12 of the substrate 10 includes holes 16 for accommodating the solder, for example.

The substrate 10 is typically manufactured using a metal removal process or a plate-up process. In a metal removal process, the insulating material 12 is provided, and an adhesive (not shown) is disposed over the insulative material 12. The insulative material 12 typically comprises a polyimide or alternatively may comprise a flexible membrane or circuit board material, as examples. A conductive foil such as copper foil is formed over the adhesive, and the conductive foil is patterned and etched, using lithographic techniques, to form contact terminals 14 and conductive traces 15. The conductive foil may be electroplated with a solderable material such as Au, for example, to improve the solderability of the contact terminals 14.

In a plate-up process, the insulative material 12 is provided, and a thin film is disposed over the insulative material 12. The thin film is conductive and is typically sputtered over the insulative material 12. The thin film may comprise Cr or Cu, as examples. A photo resist is deposited over the thin film conductive layer, and the photo resist is patterned with the desired pattern for the contact terminals 14 and conductive traces 15. The photo resist is used as a mask for the electroplating process. Using an electroplating process, the conductive material is plated through the holes in the photo resist to form contact terminals 14 and traces 15. The contact terminals 14 and traces 15 typically comprise a conductive material, such as Cu, Cr, Al, and other metals, as examples.

Figure 2:
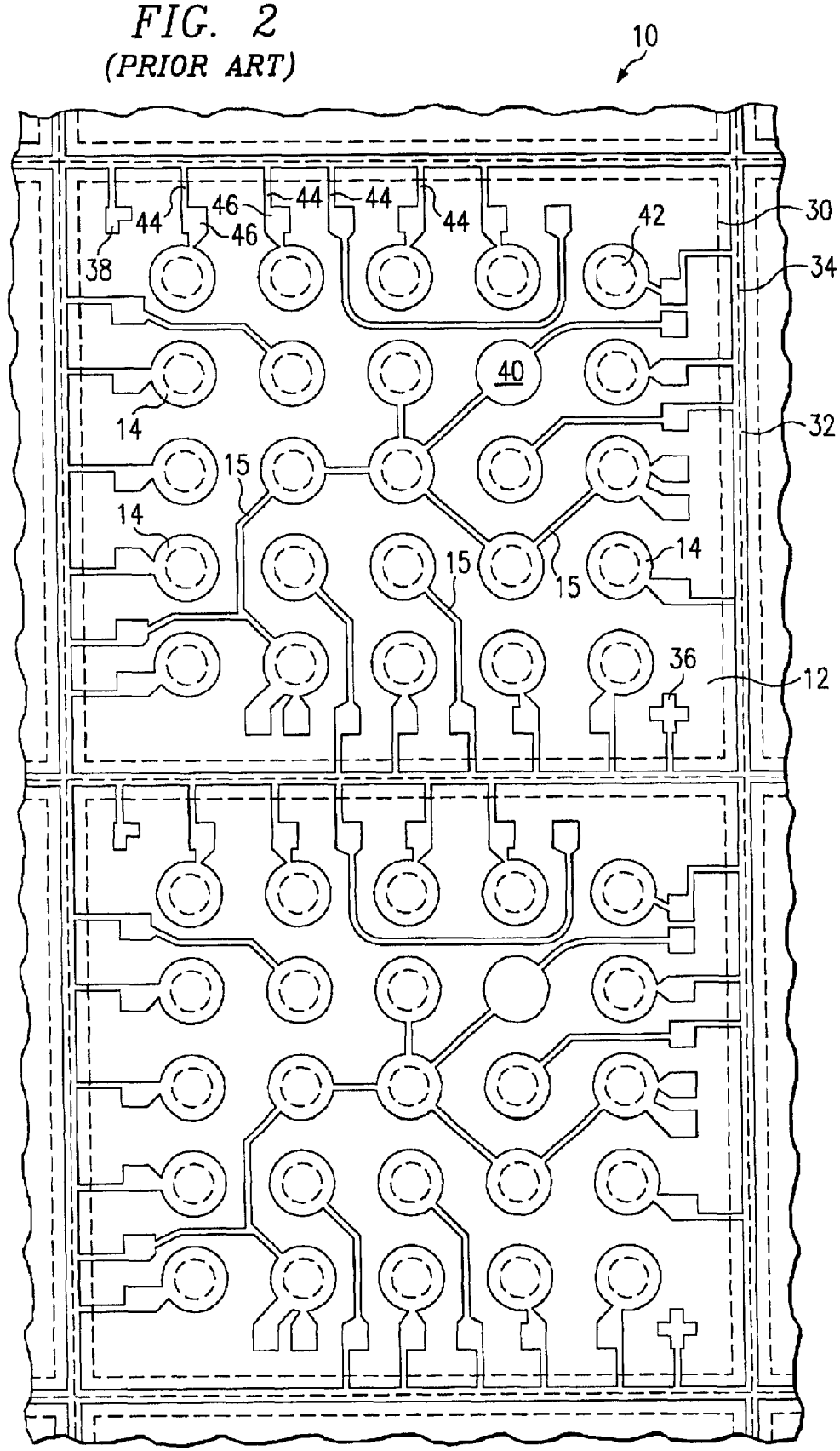
FIG. 2 illustrates a top view of the prior substrate shown in FIG. 1, which is formed by electroplating.

A top view of the substrate 10 is shown in the prior art drawing of FIG. 2. Because either in a first or final processing step, an electroplating process is used to form the contact terminals 14 and traces 15, each of the contact terminals 14 has a plating stub 44 near wire bond pads 46. The contact terminals 14 may include wire bond pads 46 which may be used to couple the IC 18 to the contact terminals 14, using wire bonds, for example (not shown in FIG. 1). The plating stubs 44 are coupled to a plating bus 32 that is conductive, in order to apply a voltage to the contact terminals 14 and traces 15 to be plated. In electroplating, the surface to be electroplated must be biased to create an electroplated coating or finish, and the item, e.g., substrate 10, is then immersed in a metal salt solution. The voltage applied attracts metal ions to the contact terminal 14 and trace 15 surface and plates a metal structure or coating thereon.

In the prior art substrate 10 shown, the plating bus 32 is positioned outside the chip/package boundary 30, and is located at the score line 34 where the individual substrates 10 will be separated during singulation. The plating bus 32 is discarded, e.g., typically the plating bus 32 is sawed away when the substrates 10 are singulated. Markers 36/38 are used for alignment of the substrate 10 during processing. The region 40 that is absent a contact terminal 14 is used to indicate the position of pin 1 at 42.

A problem with prior art substrates 10 is that each contact terminal 14 and trace 15 is required to be electrically coupled to the plating bus 32 at the score line 34 in order to electroplate the contact terminals 14 and traces 15. When the individual substrates 10 are separated, e.g. in a singulation process, plating stubs 44 of the contact terminals 14 are left remaining at the perimeter of the substrate 10. The plating stubs 44 are disadvantageous in that they act as antennae and cause interference in the operation of the packaged integrated circuit 22. When dealing with high frequency circuits or sensitive circuits, the plating stubs 44 can receive energy from external or internal signals and circuits in the ambient region, causing interference in the circuit being implemented within the package.

It is costly and time-consuming to remove the plating stubs 44 that act as antennae on the substrate 10, after the substrate 10 is manufactured. Therefore, what is needed in the art is a substrate having a contact terminal pattern that is absent the plating stubs 44 found in prior art electroplated substrates 10.

Embodiments of the present invention utilize electro-less plating, rather than electroplating, to form contact terminals on a substrate. With electro-less plating, applying a voltage to the conductive material being plated is not required. Rather, the natural potential from a metal salt solution is used to set the bias and to plate metal on the surface of a predefined pattern for electro-less plating. Therefore, with electro-less plating, plating stubs are not necessary on the contact terminal pattern. Thus, using electro-less plating prevents required use of the noise and interference-producing plating stubs, found in the prior art.

Embodiments of the present invention achieve technical advantages as a substrate and package for an integrated circuit chip having a conductive ring around the perimeter of the contact terminals. Because electro-less plating is used in accordance with embodiments of the present invention, no plating stubs are required on the contacts, making possible the formation of the conductive ring. The formation of a ground ring on a substrate is not possible using prior art electroplating processes, because the plating stubs would short each contact terminal to the conductive ring. The use of electro-less plating advantageously permits the novel use of a conductive ring around the periphery of the contact pattern, in accordance with embodiments of the invention.

Figure 3:
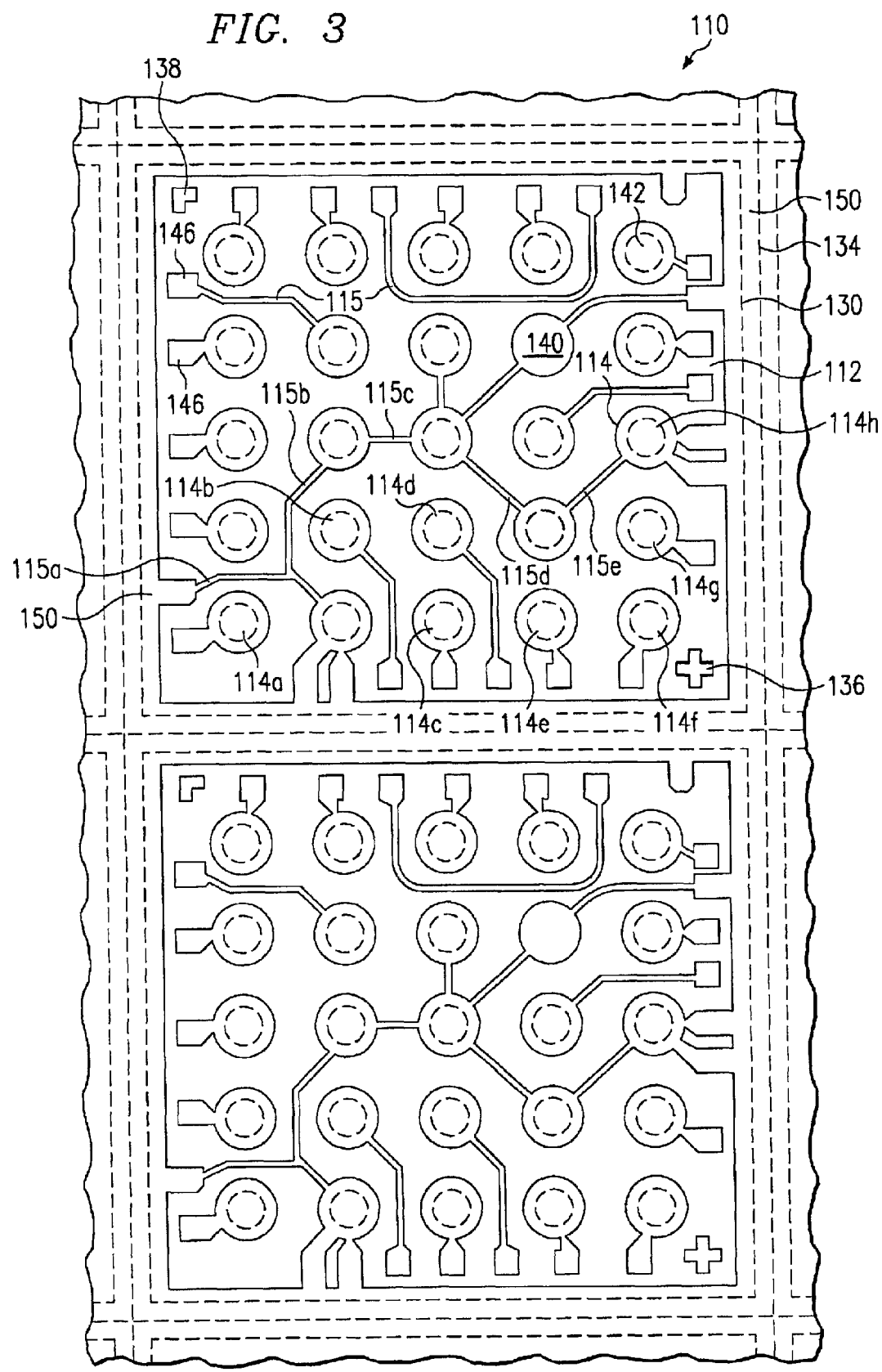
FIG. 3 shows a top view of a substrate in accordance with an embodiment of the present invention having a conductive ring around the entire perimeter of the contact terminals.

FIG. 3 shows an example top view of a wire bondable substrate 110 in accordance with an embodiment of the present invention. The substrate 110 comprises an insulative material 112 and a plurality of contact terminals or contacts 114. The contact terminals 114 may be coupled to a plurality of traces 115 disposed over the insulative material 112. The insulative material 112 may comprise polyimide, fiberglass, other PC board materials or a flexible dielectric material, as examples. The insulative material 112 includes a plurality of holes formed therein, represented by the dash lines through the contact terminals 114.

The contact terminals 114 and traces 115 comprise a conductive material, such as Cu, Pt, Sn, Ni, Ag, Au, Cr, other metals, and combinations thereof, as examples. The contact terminals 114 are preferably formed using a metal removal process or plate-through process as described herein; however, using electro-less plating, rather than electroplating, as in the prior art. Contact terminals 114 do not have plating stubs as in prior art electroplated substrates. The contact terminals 114 may include wire bond pads 146. Markers 136/138 are used to align and position the substrate 110 during processing, and region 140 indicates the location of pin 1 at 142.

The substrate 110 shown in FIG. 3 includes a conductive ring 150 disposed at outer perimeter of the substrate 110. The conductive ring 150 preferably comprises a continuous ring of conductive material such as metal, preferably comprising the same material as contact terminals 114 and traces 115. The conductive ring 150 is preferably formed at the same time that the contact terminals 114 and traces 115 are formed. Preferably, the conductive ring 150 is a solid, continuous ring disposed around the periphery of all of the contact terminals 114 and traces 115 of the substrate. The conductive ring 150 is continuous across to the next substrate 10 pattern, around the perimeter of the substrate 110. The substrate exterior edge is located at 130, and the score line is located at 134.

The conductive ring 150 prevents electrical currents from EMI and/or RFI interference from being broadcast laterally, from the integrated circuit attached thereto, or impinging from the outside world, from the perimeter of the package. Coupling the conductive ring 150 to ground results in any signal impinging on the conductive ring 150 being grounded, and not allowing the interfering signal to react with the internal circuitry or internal pattern. Simultaneously, any signal generated internal to the pattern, if grounded, is not allowed to broadcast horizontally.

In accordance with an embodiment of the present invention, one or more contact terminals 114 may be surrounded by a trace of conductive material 115, e.g., contact terminal 114a, which is surrounded by conductive material 115a that is coupled to the conductive ring 150. When the conductive ring 150 is coupled to ground, contact terminal 114a can be used as a controlled impedance connection, such as a 50 Ω coaxial connection, as an example. This is advantageous for high speed or sensitive circuits and signals, as examples. Similarly, a plurality of contact terminals 114, or groups of contact terminals 114b/114c/114d/114e/114f/114g may be shielded in this manner by disposing a plurality of traces 115b/115c/115d of conductive material around the contact terminal 114 groups and coupling the conductive material traces to the conductive ring 150, for example, as shown.

In accordance with embodiments of the invention, the conductive ring 150 may be coupled to ground through the internal contacts of the pattern in order to provide shielding and EMI/RFI protection. For example, in FIG. 3, contact terminal 114h is coupled to the conductive ring 150. Alternatively, the continuous ring 150 may be coupled to a power signal, in order to provide lateral shielding and EMI/RFI protection, to distribute electrical power to certain contact terminals 114 without the requirement of additional package connection pins for individual electrical connection, and/or to provide balancing of electrical power provided to the IC 118, as examples.

Figure 4:
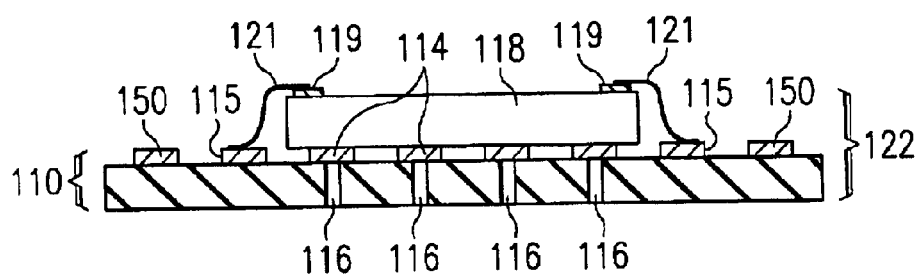
FIG. 4 illustrates a cross-sectional view of the substrate in accordance with an embodiment of the present invention with a flip chip integrated circuit chip bonded thereto.

FIG. 4 shows a cross-sectional view of a substrate 110 in accordance with an embodiment of the present invention having an insulative material 112, contact terminals 114 disposed thereon, and conductive ring 150 disposed at the perimeter of the contact terminals 114. The insulative material 112 may include a plurality of holes 116, with each hole 116 residing beneath each contact terminal 114 and being adapted to accommodate solder, for example. The substrate 110 may be coupled to an integrated circuit chip 118, as shown, by wire bond or tab bond 121 or other electrical connection means. The conductive ring 150 is preferably coupled to one or more contact terminals or contacts 114, e.g. to power or ground, not shown.

Figure 5:
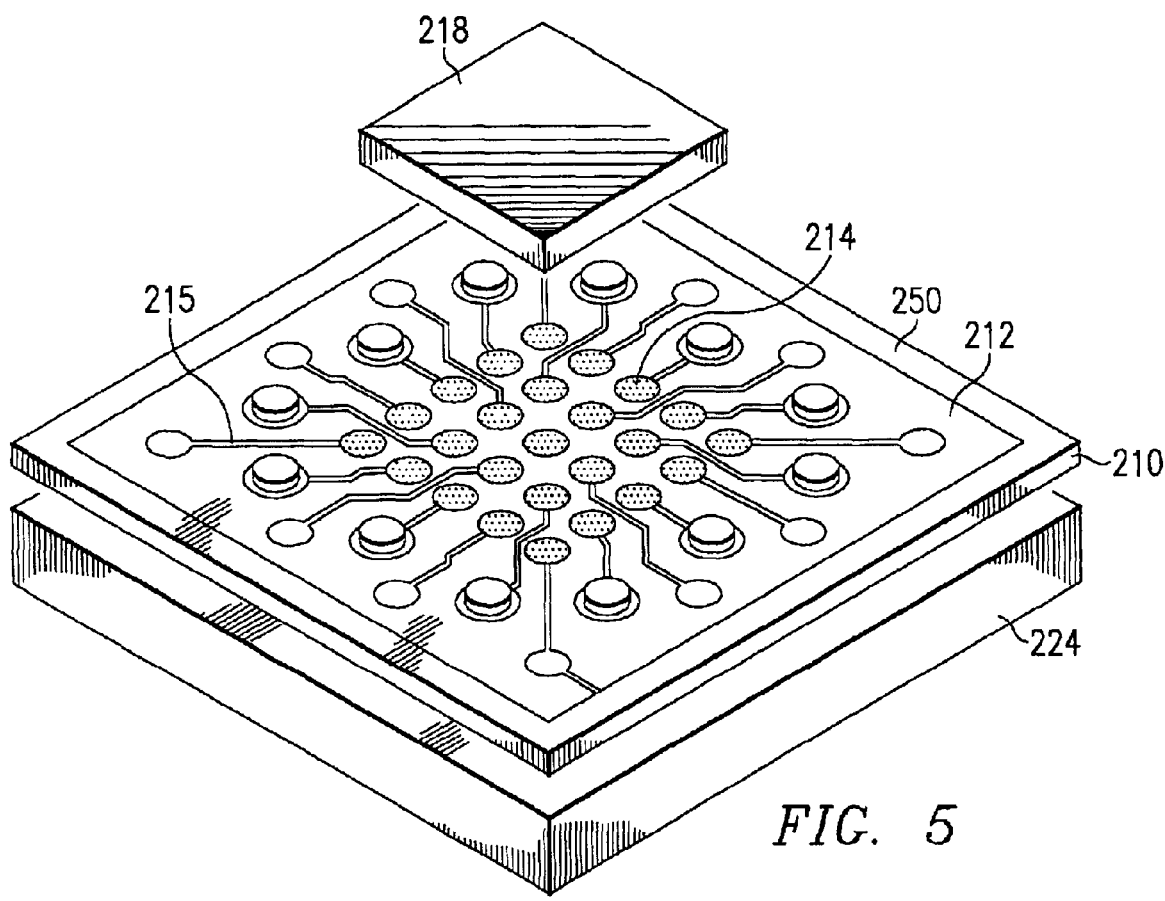
FIG. 5 illustrates a perspective view of a flip-chip package including a substrate having a continuous conductive ring around the perimeter of the contact terminals with an electrical connection to a package ground pin.

FIG. 5 shows a perspective view of a flip-chip, an application that draws benefit from the conductive ring 250 structure for a substrate 210 in accordance with an embodiment of the present invention. Substrate 210 includes insulative material 212 with contact terminals 214 and conductive traces 215 disposed thereon, which have been formed using an electro-less plating process, for example. Preferably, conductive ring 250 is formed at the same time that the contact terminals 214 and traces 215 are formed. Conductive ring 250 is preferably coupled to at least one contact 214, as shown. The substrate 210 shown may also be used in a contactor application, e.g. such as the one described in U.S. Pat. No. 5,982,186 issued Nov. 9, 1999 to Buschbom. An integrated circuit chip 218 is coupled the contact terminals 214, for example, using solder (not shown). The substrate 210 is then coupled to a PCB 224.

Figure 6:
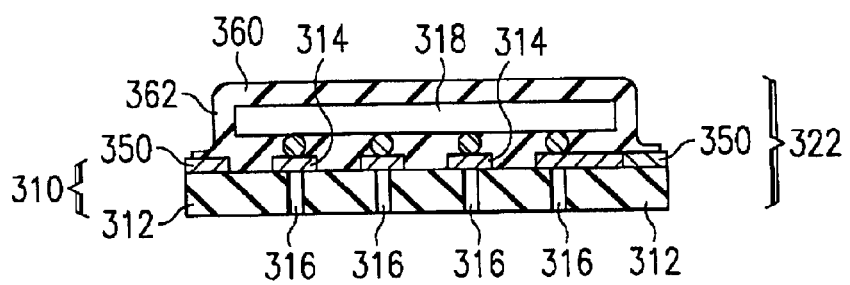
FIG. 6 illustrates a cross-sectional view of an embodiment of the present invention having an encapsulating insulative material disposed over the integrated circuit chip and substrate.

FIG. 6 illustrates a cross-sectional view of an embodiment of the present invention, including a substrate 310 having an insulative material 312, contact terminals 314 and traces 15 (not shown) disposed thereon, and conductive ring 350 disposed at the perimeter of the contact terminals 314. The insulative material 312 may include a plurality of holes 316, with each hole 316 residing beneath each contact terminal 314 and being adapted to accommodate solder, for example. The substrate 310 may be coupled to an integrated circuit chip 318, as shown, by solder 320 or other electrical connection means.

After the substrate 310 is coupled to integrated circuit chip 318, the assembly is covered with an encapsulating insulative material 360. The encapsulating insulative material 360 may comprise epoxy or other dielectric materials, as examples. Preferably, the encapsulating dielectric material 360 is conformal, as shown. The structure shown depicts a completely sealed integrated circuit package 322.

Figure 7:
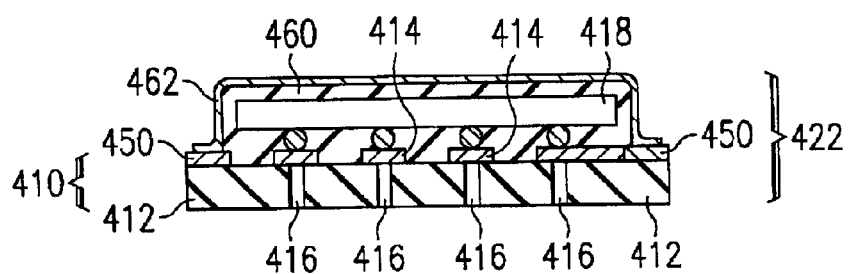
FIG. 7 shows a cross-sectional view of an embodiment of the present invention having an encapsulating insulative material disposed over the integrated circuit chip and substrate, and further having a conductive or dissipative material disposed over the encapsulating insulative material and making electrical contact to the peripheral conductive ring of the substrate and subsequently to a ground pin through an internal connection on the substrate.

In the embodiment of the packaged IC 422 shown in FIG. 7 which includes elements having like numerals for the elements previously described herein, a conductive or dissipative material 462 is disposed over encapsulating insulative material 460. In accordance with one embodiment, the conductive or dissipative material 462 may be electrically coupled to the conductive ring 450 of the substrate 410. This is achievable because the conductive ring 450 is exposed at the edge of the substrate 410. This is advantageous in that a completely sealed and shielded packaged integrated circuit chip 422 is provided. The conductive or dissipative material 462 may comprise a conductive material such as a metallized surface comprising gold or copper as examples, or alternatively, the conductive material 462 may comprise a dissipative material comprising a material having a resistance of less than about one MΩ, for example. The conductive material 462 may comprise a flash of Ni, Cu, Au, Ag, Pt, Sn, or other metals, as examples. Alternatively, a high carbon content film such as static or charge dissipative ink, as an example, may be utilized. The conductive material 462 may be applied by plating, evaporation, or by dipping the packaged IC 422 into a dissipative solution, as examples. Grounding the conductive ring 450 in this embodiment results in an EMI/RFI shielded integrated circuit package 422. This is particularly advantageous for sensitive applications with low signal levels such as Bluetooth, a registered trademark of Ericsson, for example.

The packaged IC's 122, 222, 322, 422 may be coupled to a PCB 224 (see FIG. 5). For example, holes 116/316/416 may be filled with solder, e.g., by screening it in or using a solder paste. The solder may be reflowed, or a solder ball may be added to the package 122, 222, 322, 422.

The contact terminals 214/314/414 may be coupled directly to the contacts of an integrated circuit die, using solder, for example, in a flip-chip type of integrated circuit, as shown in FIGS. 5, 6 and 7. Alternatively, the contact terminals 114 may include wire bond pads 146 which may be used to electrically couple an integrated circuit chip 118 having contacts 119 around the perimeter of the chip 118 to the substrate wire bond pads 146 using wire bonds 121, for example, as shown in FIG. 4. The packaged IC 122 may be subsequently coupled to a PCB, using solder, for example, similar to the configuration shown in FIG. 1.

While embodiments of the present invention are described herein with reference to chip scale packages, they also have useful application in other types of packages, e.g., ball grid array, flip-chip, tape automated bond (TAB), wire bond substrates, film type substrates, PC board substrates and stand-alone packages. The substrates may be formed in an array on strips, in a tape structure, a panel or a PC board, as examples.

Embodiments of the present invention provide several advantages over prior art IC packages. Advantages of embodiments of the present invention include providing a conductive ring 150/250/350/450 around contacts 114/214/314/414 of a surface mount integrated circuit chip substrate 110/210/310/410, which may be used for shielding or for providing power. Individual contacts or terminals 114/214/314/414 may be completely surrounded by a ground signal, which is particularly advantageous for coaxial connections, high-speed applications, or sensitive signals. Groups of contacts or terminals 114/214/314/414 may also be shielded, which is advantageous in certain design scenarios. A substrate 110/210/310/410 having a conductive ring 150/250/350/450 according to embodiments of the present invention may be covered with an insulative material 360/460, and the insulative material 360/460 may be coated with a conductive or dissipative material 462 to provide a completely electromagnetic interference EMI/RFI shielded package 422. Advantageously, the conductive ring 150/250/350/450 may be formed when the substrate terminals 114/214/314/414 patterned. The substrate 110/210/310/410 according to embodiments of the present invention does not have plating stubs on contact terminals, problematic in prior art electroplated substrates.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A substrate for an unpackaged integrated circuit chip having surface mount contacts disposed thereon in a pattern, comprising:
    an insulating material; and
    a conductive material disposed over the insulating material, the conductive material comprising a plurality of contacts arranged in a pattern corresponding to the integrated circuit contact pattern, the conductive material comprising a conductive ring disposed around the periphery of the contact pattern, the conductive material comprising a first trace connected to said conductive ring and surrounding a selected one of said plurality of contacts, wherein the substrate contacts are coupleable to the integrated circuit chip surface mount contacts.

2. The substrate according to claim 1, wherein the conductive material comprises at least one conductive trace disposed proximate at least one contact.

3. The substrate according to claim 1, wherein the substrate contacts comprise wire bond pads, wherein the wire bond pads are coupleable to the integrated circuit chip surface mount contacts.

4. The substrate according to claim 1, wherein the insulating material comprises polyimide, fiberglass or a flexible dielectric material.

5. The substrate according to claim 1, wherein the insulating material includes a plurality of apertures disposed in the integrated circuit contact pattern.

6. The substrate according to claim 1 wherein the conductive material comprises Cu, Pt, Sn, Ni, Ag, Au, Cr, or combinations thereof.

7. The substrate according to claim 1, wherein the conductive material is formed by electro-less plating.

8. The packaged integrated circuit of claim 1, wherein said first trace surrounds selected contacts in said plurality of contacts.

9. The packaged integrated circuit of claim 1, wherein said selected one of said plurality of contacts is a controlled impedance connection.

10. A package for an integrated circuit chip having surface mount contacts disposed thereon in a pattern, comprising:
    a substrate including an insulating material and a conductive material disposed over the insulating material, the conductive material comprising a plurality of contacts arranged in a pattern corresponding to the integrated circuit contact pattern, the conductive material comprising a conductive ring disposed around the periphery of the contact pattern, the conductive material comprising a first trace connected to said conductive ring and surrounding a selected one of said plurality of contacts, wherein the substrate contacts are coupleable to the integrated circuit chip surface mount contacts.

11. The package according to claim 10, wherein the conductive material comprises at least one conductive trace disposed proximate at least one contact.

12. The package according to claim 10, wherein the substrate contacts comprise wire bond pads, wherein the wire bond pads are coupleable to the integrated circuit chip surface mount contacts.

13. The package according to claim 10, further comprising an encapsulating insulating material disposed over the integrated circuit and substrate.

14. The package according to claim 13, further comprising a shielding material disposed over the encapsulating insulating material, the shielding material being electrically coupled to the conductive material solid ring.

15. The package according to claim 14, wherein the shielding material comprises an electrically conductive material.

16. The package according to claim 14, wherein the shielding material comprises a dissipative material having less than about 1 MΩ resistance.

17. The package according to claim 10, wherein the substrate insulating material comprises polyimide, fiberglass or a flexible dielectric material, and wherein the conductive material comprises Cu, Pt, Sn, Ni, Ag, Au, Cr, or combinations thereof.

18. The package according to claim 10, wherein the substrate insulating material includes a plurality of apertures disposed in the integrated circuit contact pattern.

19. The package according to claim 10, wherein the substrate conductive material is formed by electro-less plating.

20. The package according to claim 10, wherein the integrated circuit comprises a ball grid array, chip scale package, or flip-chip.

21. An integrated circuit packaged in the package of claim 10.

22. The packaged integrated circuit of claim 10, wherein said first trace surrounds selected contacts in said plurality of contacts.

23. The packaged integrated circuit of claim 10, wherein said selected one of said plurality of contacts is a controlled impedance connection.

24. A packaged integrated circuit, comprising:
    a substrate including an insulating material and a conductive material disposed over the insulating material, the conductive material comprising a plurality of contacts, the conductive material further comprising a conductive ring disposed around the periphery of said plurality of contacts, the conductive material further comprising a trace connected to said conductive ring and surrounding a selected one of said plurality of contacts.

25. The packaged integrated circuit of claim 24, wherein said trace surrounds selected contacts in said plurality of contacts.

26. The packaged integrated circuit of claim 24, wherein said selected one of said plurality of contacts is a controlled impedance connection.

* * * * *